United States Patent
Meeks et al.

(10) Patent No.: US 7,701,746 B2
(45) Date of Patent: Apr. 20, 2010

(54) METHOD OF MAKING MEMORY CELL WITH VOLTAGE MODULATED SIDEWALL POLY RESISTOR

(75) Inventors: Albert Meeks, Sunnyvale, CA (US); Xiaoyu Yang, Campbell, CA (US); Kim Le, San Jose, CA (US)

(73) Assignee: SanDisk 3D, LLC, Milpitas, CA (US)

( * ) Notice: Subject to any disclaimer, the term of this patent is extended or adjusted under 35 U.S.C. 154(b) by 288 days.

(21) Appl. No.: 11/819,561

(22) Filed: Jun. 28, 2007

(65) Prior Publication Data

US 2009/0003082 A1 Jan. 1, 2009

(51) Int. Cl.
*G11C 11/00* (2006.01)
(52) U.S. Cl. .................. 365/148; 365/185.28; 365/163; 365/171
(58) Field of Classification Search ............ 365/185.01, 365/185.28 X, 148 O, 163 X, 185.28, 148, 365/163; 665/171 X, 171
See application file for complete search history.

(56) References Cited

U.S. PATENT DOCUMENTS

| | | | | |
|---|---|---|---|---|
| 4,077,044 A | * | 2/1978 | Hayashi | 257/316 |
| 6,881,994 B2 | * | 4/2005 | Lee et al. | 257/296 |
| 6,952,030 B2 | | 10/2005 | Herner et al. | |
| 2006/0152961 A1 | * | 7/2006 | Kim et al. | 365/148 |
| 2007/0029607 A1 | * | 2/2007 | Kouznetzov | 257/321 |
| 2007/0072360 A1 | | 3/2007 | Kumar et al. | |

OTHER PUBLICATIONS

U.S. Appl. No. 11/819,562, filed Jun. 28, 2007, Meeks.

* cited by examiner

*Primary Examiner*—VanThu Nguyen
(74) *Attorney, Agent, or Firm*—Foley & Lardner LLP

(57) ABSTRACT

A method of making a two terminal nonvolatile memory cell includes forming a first electrode, forming a charge storage medium, forming a resistive element, and forming a second electrode. The charge storage medium and the resistive element are connected in parallel between the first and the second electrodes, and a presence or absence of charge being stored in the charge storage medium affects a resistivity of the resistive element.

14 Claims, 9 Drawing Sheets

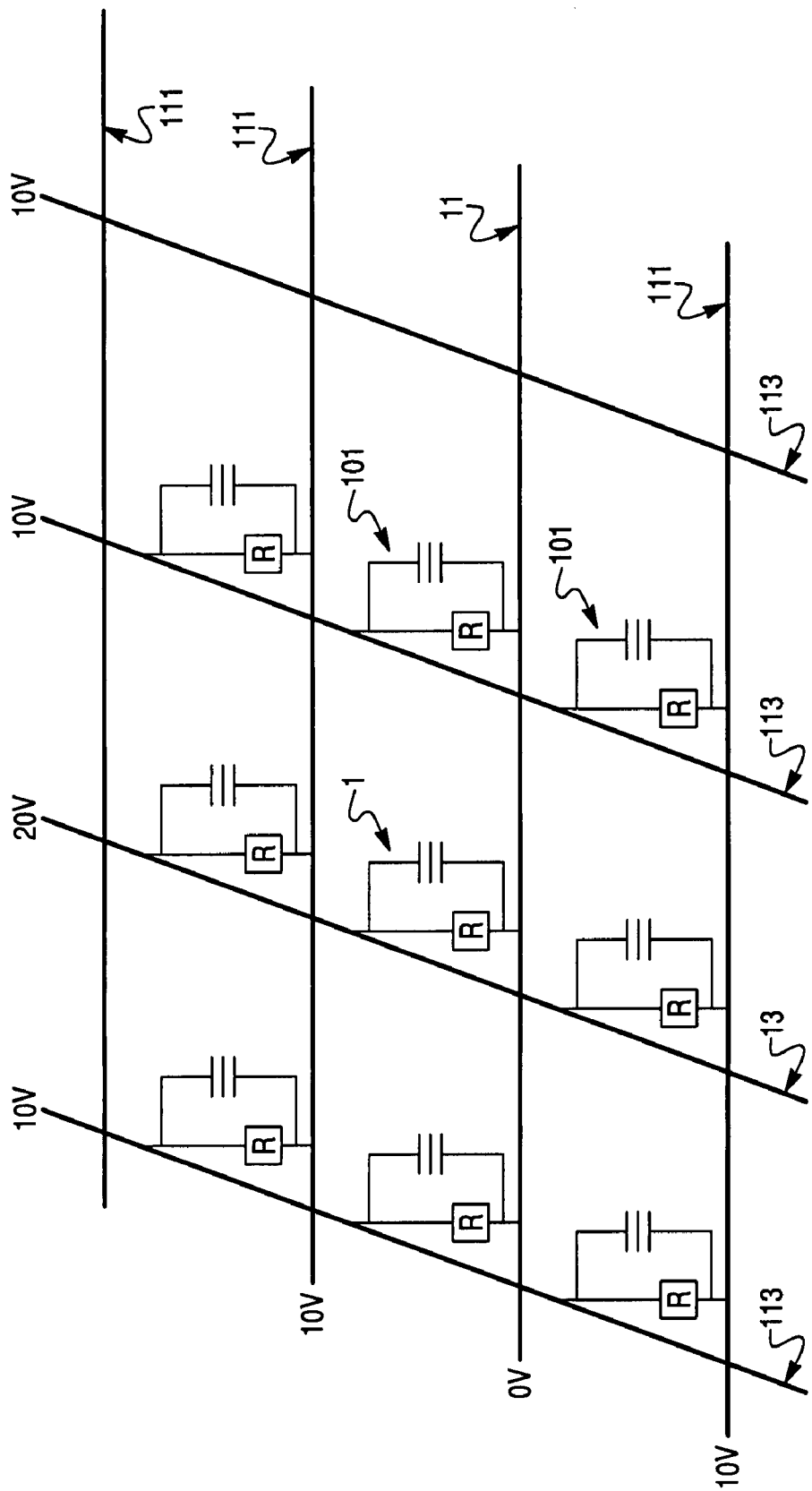

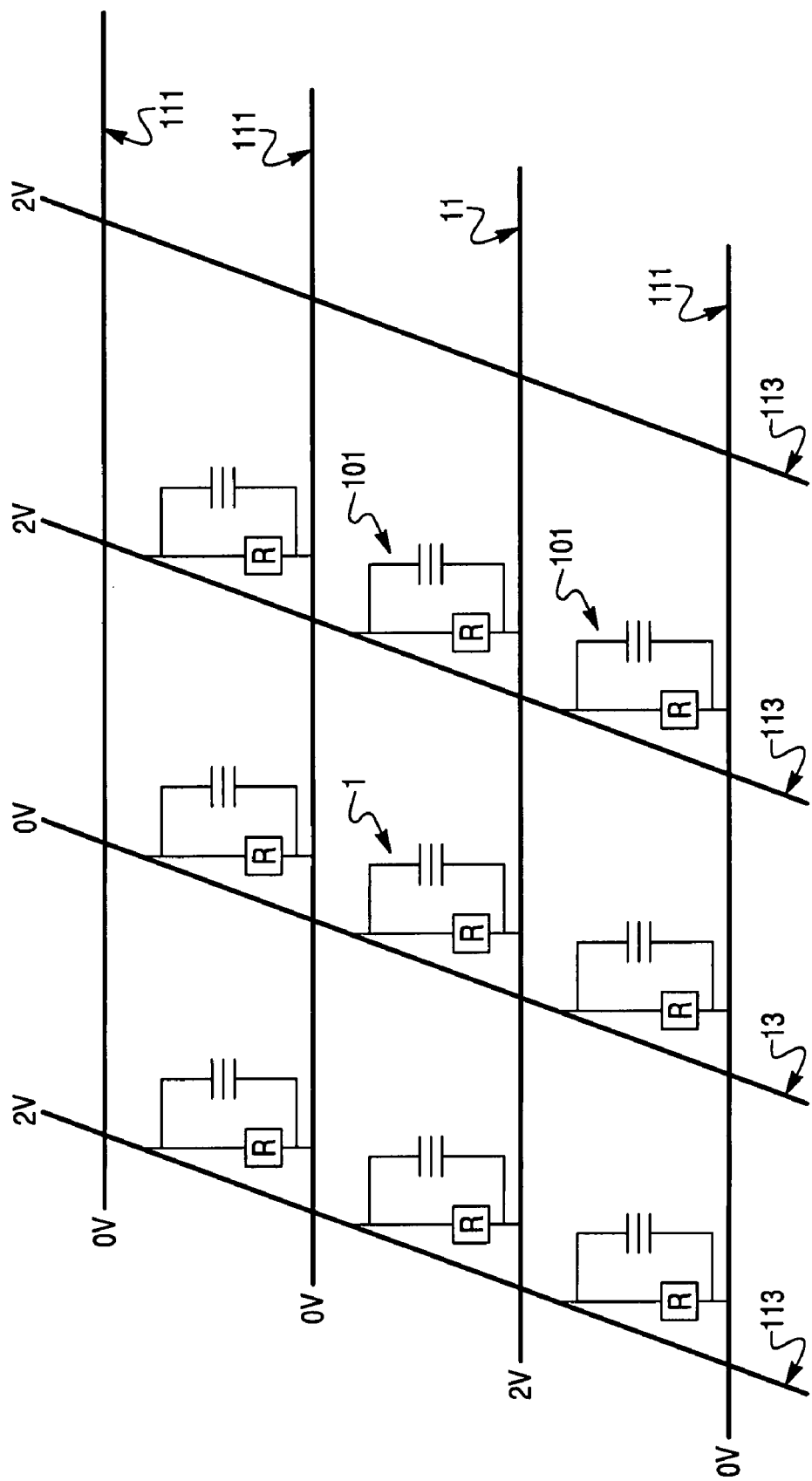

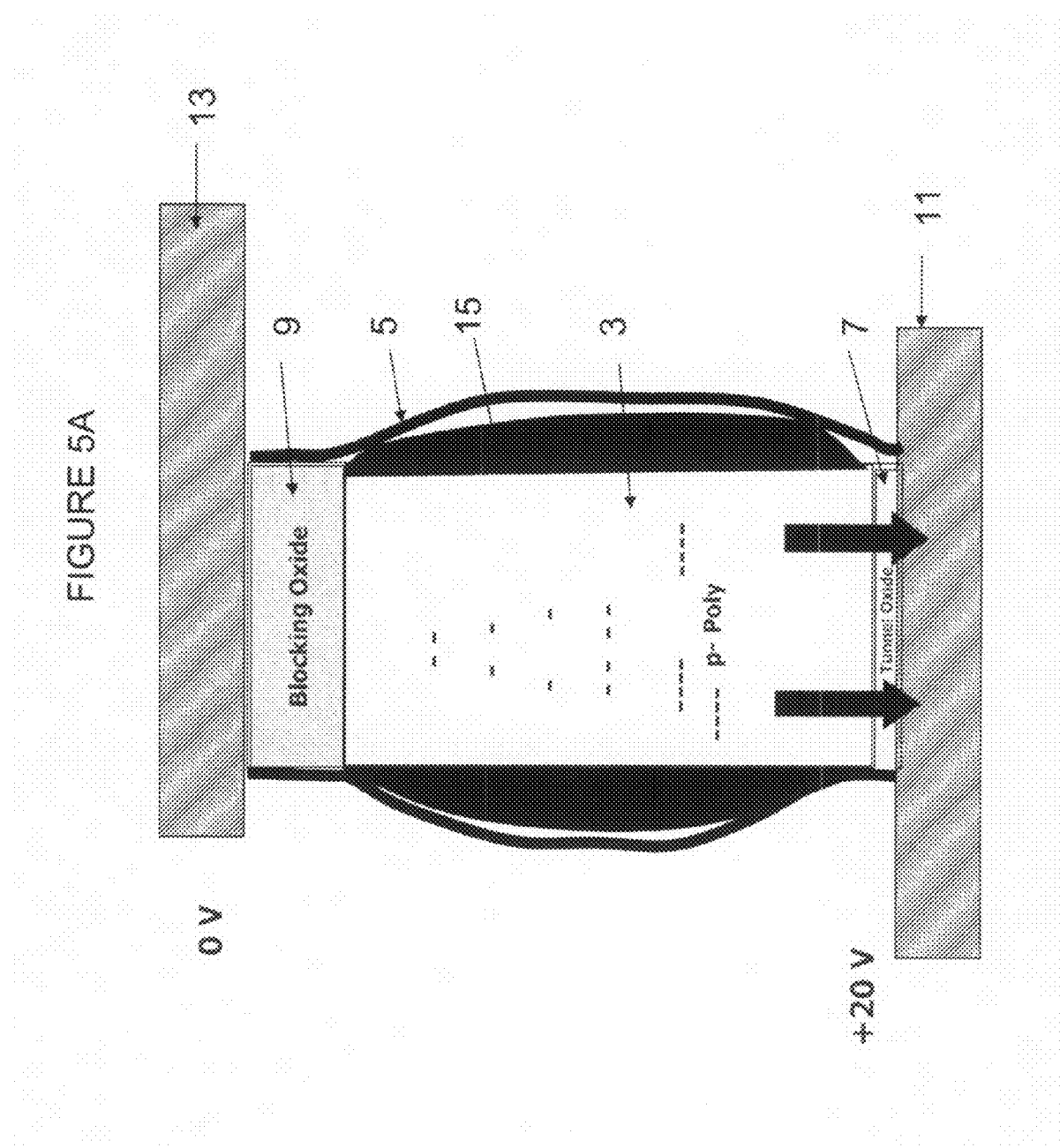

METHOD OF MAKING MEMORY CELL WITH VOLTAGE MODULATED SIDEWALL POLY RESISTOR

This application is related to Meeks, et al., U.S. application Ser. No. 11/819,562, titled "MEMORY CELL WITH VOLTAGE MODULATED SIDEWALL POLY RESISTOR", filed on the same day herewith, and hereby incorporated by reference in its entirety.

BACKGROUND OF THE INVENTION

The invention relates to a nonvolatile memory device and to methods of making and operating thereof.

Nonvolatile memory arrays maintain their data even when power to the device is turned off. In one-time-programmable arrays, each memory cell is formed in an initial unprogrammed state, and can be converted to a programmed state. This change is permanent, and such cells are not erasable. In other types of memories, the memory cells are erasable, and can be rewritten many times.

Cells may also vary in the number of data states each cell can achieve. A data state may be stored by altering some characteristic of the cell which can be detected, such as current flowing through the cell under a given applied voltage or the threshold voltage of a transistor within the cell. A data state is a distinct value of the cell, such as a data '0' or a data '1'.

Some solutions for achieving erasable or multi-state cells are complex. Floating gate and SONOS memory cells, for example, operate by storing charge, where the presence, absence or amount of stored charge changes a transistor threshold voltage. These memory cells are three-terminal devices which are relatively difficult to fabricate and operate at the very small dimensions required for competitiveness in modern integrated circuits.

SUMMARY OF THE PREFERRED EMBODIMENTS

A first embodiment of the invention provides a method of making a two terminal nonvolatile memory cell comprising forming a first electrode, forming a charge storage medium, forming a resistive element, and forming a second electrode. The charge storage medium and the resistive element are connected in parallel between the first and the second electrodes, and a presence or absence of charge being stored in the charge storage medium affects a resistivity of the resistive element.

Another embodiment of the invention provides a method of making a nonvolatile memory device, comprising forming a first electrode over a substrate, forming a tunneling dielectric on a first portion of the first electrode, forming a semiconductor pillar charge storage medium on the tunneling dielectric, forming a separator dielectric adjacent to at least one sidewall of the semiconductor pillar, forming a semiconductor resistor adjacent to the separator dielectric, forming a blocking dielectric over the semiconductor pillar, and forming a second electrode over the blocking dielectric and over the semiconductor pillar. The semiconductor resistor electrically contacts the second electrode and a second portion of the first electrode.

Another embodiment of the invention provides a method of operating a two terminal nonvolatile memory cell, comprising a data writing step comprising injecting charge into the charge storage medium through a tunneling dielectric, and a data reading step comprising sensing a resistivity of a resistive element located adjacent to the charge storage medium, wherein the resistivity of the resistive element varies based on a presence or absence of charge being stored in the charge storage medium.

Each of the aspects and embodiments of the invention described herein can be used alone or in combination with one another. The preferred aspects and embodiments will now be described with reference to the attached drawings.

BRIEF DESCRIPTION OF THE DRAWINGS

FIGS. 3A, 3B, 4A and 5A are side cross sectional views of the cell of FIG. 1 during a write operation, after the write operation, during a read operation and during an erase operation, respectively.

FIGS. 3C, 4B and 5B are circuit schematics of the array shown in FIG. 2 during the write operation, during the read operation and during the erase operation, respectively.

DETAILED DESCRIPTION OF THE PREFERRED EMBODIMENTS

The embodiments of present invention provide a two terminal nonvolatile memory cell in which a charge storage medium and a resistive element are connected in parallel between two electrodes. A presence or absence of charge being stored in the charge storage medium affects a resistivity of the resistive element and thus affects the read current between the two electrodes. As will be described in more detail below, the term "connected in parallel" means that the same two electrodes are used to write and erase the cell by causing charge flow into and from the charge storage region, respectively, as well as to read the cell by generating a read current through the resistive element. This term does not require the electrodes to physically contact the charge storage medium, and as will be described below, in a preferred embodiment, insulating layers separate the charge storage medium from the electrodes. Thus, a three terminal transistor device, such as a transistor, which is complex to fabricate and operate, is not required to form a non-volatile memory cell.

Figure 1:
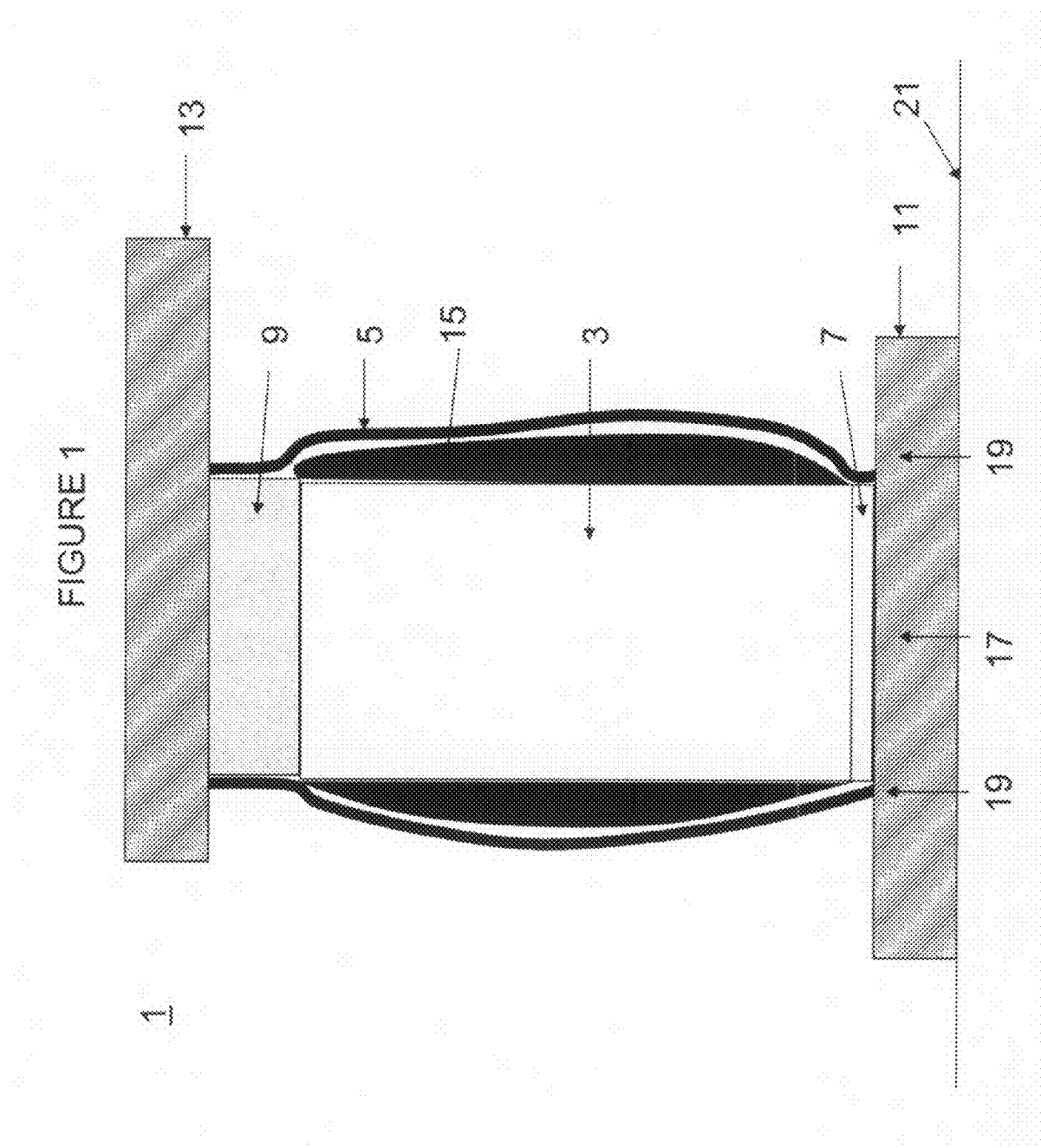
FIG. 1 is side cross sectional view of a memory cell formed according to an embodiment of the present invention.

FIG. 1 illustrates one embodiment of the non-volatile memory cell 1. The cell includes the charge storage medium 3 and the resistive element 5. In one aspect of the invention, the charge storage medium 3 comprises a semiconductor floating gate. The term "gate" is used herein by analogy to a floating gate in a floating gate charge storage transistor which also contains a control gate, but should not imply that a transistor is formed. Specifically, the floating gate is not electrically connected to an electrode, and is thus not considered to be a transistor gate. For example, the semiconductor floating gate may comprise a polycrystalline silicon (polysilicon) floating gate. Other semiconductor materials may also be used. The charge storage medium may be about 150 to about 300 nm thick (in the vertical direction in FIG. 1), such as about 200 nm thick, and about 100 to about 1000 nm wide, for example.

The charge storage medium 3 is located between a tunneling dielectric layer 7 and a blocking dielectric layer 9. The tunneling dielectric 7 is located between a first electrode 11 and the charge storage medium 3. The tunneling dielectric 7 is sufficiently thin to allow charge carriers to tunnel between the first electrode 11 and the charge storage medium 3 through the tunneling dielectric 7. For example, the tunneling dielectric 7 may be about 1 to about 7 nm thick, such as about 2 nm thick. The tunneling dielectric 7 may comprise a silicon oxide layer, for example. One or more other insulating layers, such as silicon nitride, aluminum oxide or other metal oxide layers may also be used.

The blocking dielectric 9 is located between the charge storage medium 3 and the second electrode 13. The blocking dielectric 9 is preferably thicker than the tunneling dielectric to prevent charge carriers from tunneling between the charge storage medium 3 and the second electrode 13. The blocking dielectric 9 may be about 10 to about 30 nm thick, such as about 15 nm thick. The blocking dielectric 9 may comprise a silicon oxide layer, for example. One or more other insulating layers, such as silicon nitride, aluminum oxide or other metal oxide layers may also be used.

In another aspect of the invention, the charge storage medium 3 comprises a charge storage dielectric layer which is located between the tunneling dielectric layer 7 and the blocking dielectric layer 9. For example, the charge storage dielectric layer 3 may comprise a silicon nitride layer, while the tunneling dielectric and the blocking dielectric layers comprises silicon oxide layers to form a so-called ONO structure. Other suitable materials may also be used.

The resistive element 5 is preferably any element whose resistivity is affected by a presence or absence of charge being stored in the charge storage medium 3. For example, the resistive element 5 may comprise a resistor, such as a semiconductor resistor. The semiconductor resistor may comprise a lightly doped or undoped polysilicon or other semiconductor material. The resistor may have a resistance of about $10^{11}$ to about $10^{13}$ Ohms, for example about $10^{12}$ Ohms. The resistor may be about 5 to about 20 nm thick (in the horizontal direction in FIG. 1), such as about 10 nm thick, for example.

Alternatively, the resistive element 5 may comprise a semiconductor diode. For example, the diode may comprise a single crystal silicon or polysilicon diode. Other semiconductor materials may also be used. The diode 5 may comprise a p-n diode with a p-type doped region located adjacent to one electrode 11 or 13 and an n-type doped region located adjacent to the other electrode 13 or 11. If desired, the diode may comprise a p-i-n diode in which an intrinsic or a very lightly doped region is located between the p-type and the n-type regions.

The electrodes 11, 13 may comprise any suitable conductive layer or layers. For example, the electrodes 11, 13 may comprise aluminum, copper, tungsten, titanium or their alloys, such as Ti—W. Alternatively, one or both electrodes may comprise highly doped polysilicon. Various barrier layers, such as TiN barrier layers, may also be provided as part of the electrodes.

The device 1 also includes a separator dielectric layer 15 which is located between the resistive element 5 and the charge storage medium 3. The separator dielectric 15 is sufficiently thin to allow a presence or absence of charge being stored in the charge storage medium 3 to affect the resistivity of the resistive element 5. The separator dielectric 15 may be about 3 to about 10 nm thick (in the horizontal direction in FIG. 1), such as about 5 nm thick, for example. The separator dielectric 15 may comprise a silicon oxide layer, for example. One or more other insulating layers, such as silicon nitride, aluminum oxide or other metal oxide layers may also be used.

In the embodiment shown in FIG. 1, the cell 1 comprises a vertical cell. In other words, the cell 1 is oriented vertically with respect to a substrate 21 which is located below the first electrode 11. The substrate may comprise a semiconductor substrate, such as a silicon wafer, or a non-semiconductor substrate, such as a glass, metal, ceramic or plastic substrate. The substrate may have various layers and/or devices formed on and/or in it, such as driver circuits or other logic circuits. The driver circuit(s) may be formed below the memory cell 1, above the memory cell 1 or laterally adjacent to the memory cell 1.

The first electrode 11 is located over the substrate 21 (i.e., directly on the substrate or spaced apart from the substrate by intervening layers). The tunneling dielectric 7 is located on a first portion 17 of the first electrode 11. The charge storage medium 3 comprises a pillar which is located on the tunneling dielectric 7. The pillar may have a circular, square, rectangular, oval or other suitable cross section.

The separator dielectric 15 is located adjacent to at least one sidewall of the pillar 3. For example, the separator dielectric 15 contacts the pillar 3 sidewall(s) and surrounds the pillar 3. Alternatively, the separator dielectric 15 may be located on one or more sides of the pillar 3, but not completely surround the pillar.

The resistive element 5 is located adjacent to the separator dielectric 15. The resistive element 5 electrically contacts the second electrode 13 and a second portion 19 of the first electrode 11. For example, the resistive element 5 contacts the separator dielectric 15 and surrounds the separator dielectric. Alternatively, resistive element 5 may be located on one or more sides of the dielectric 15 but not completely surround it.

The blocking dielectric 9 is located over the pillar 3. The second electrode 13 is located over the blocking dielectric 9 and over the pillar 3.

While a vertical cell is shown in FIG. 1, it should be understood that other configurations are possible. For example, the cell may be oriented horizontally. In this case, the charge storage medium 3 may be located above or below the resistive element 5. Alternatively, the charge storage medium 3 and the resistive element 5 may be located horizontally side by side over a surface of the substrate.

Figure 2:
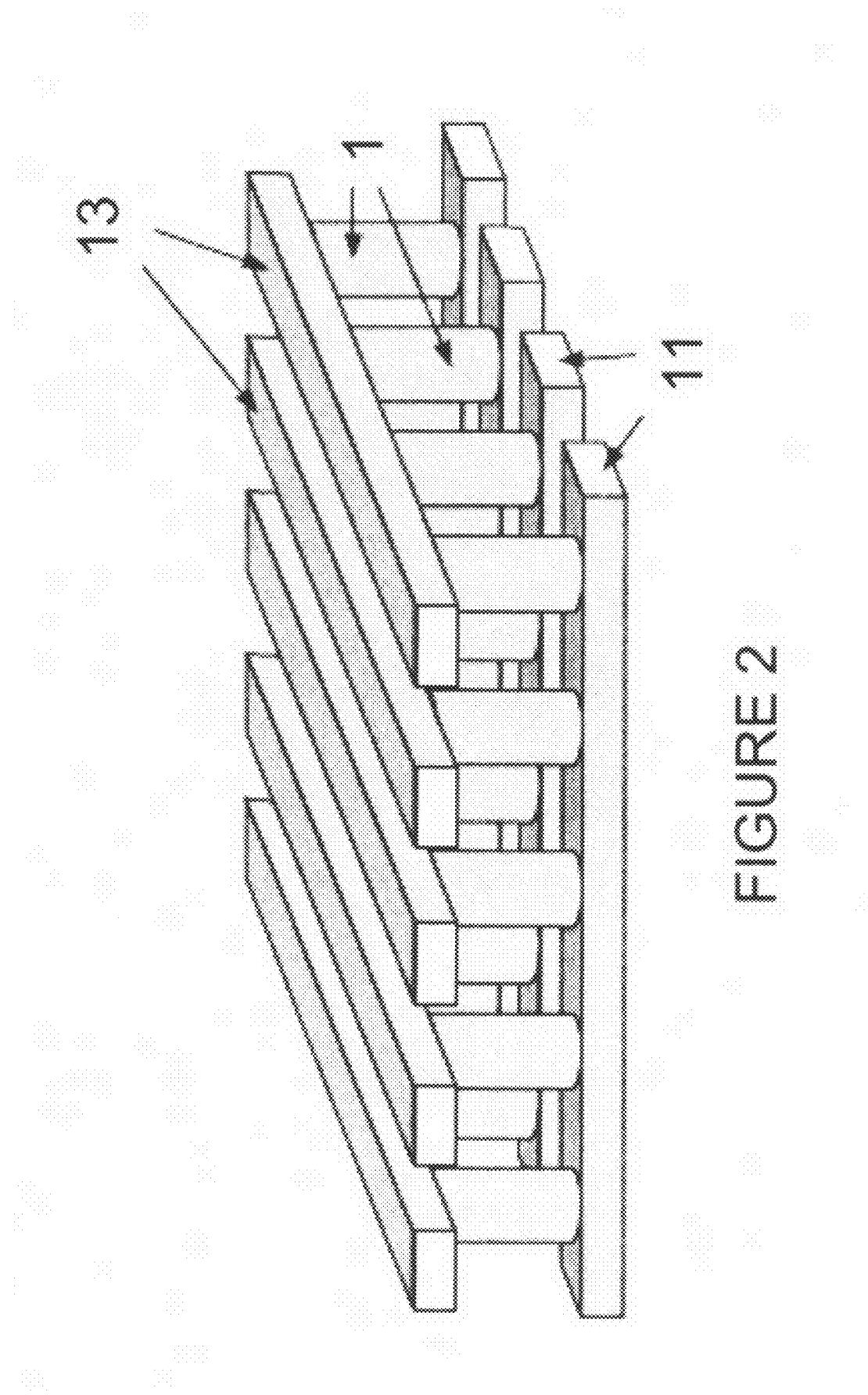
FIG. 2 is a perspective view of a portion of a memory level comprising the memory cells of FIG. 1.

FIG. 2 shows an array of non-volatile memory cell array including a plurality of the vertical two terminal nonvolatile memory cells 1. As can be seen from FIG. 2, each electrode 11, 13 may extend to contact more than one cell, such as a row or column of cells. The electrodes 11, 13 may extend in roughly perpendicular directions, such that one electrode 11, 13 extends in a row direction while the other electrode 13, 11 extends in a column direction. The spaces between the cells 1 may be filed with an insulating fill layer, such as silicon oxide, silicon nitride, BPSG, etc.

One non-limiting method of making the cell 1 comprises the following steps. The first electrode 11 is formed over the substrate 21. Driver circuits or other devices may be formed in or over the substrate below the first electrode 11. The first electrode 11 may be formed by depositing one or more conductive layer(s) and patterning the conductive layer(s) by direct photolithography or lift-off methods.

The tunneling dielectric 7 is then formed on the first electrode 11 by depositing an insulating layer, such as silicon oxide, on the electrode 11.

The charge storage medium 3 is then formed on the tunneling dielectric layer 7. For example, a polysilicon layer, such as a lightly doped p-type or n-type polysilicon layer, may be formed on the tunneling dielectric layer 11. This is followed by forming the blocking dielectric layer 9 over the polysilicon layer. The tunneling dielectric, polysilicon layer and blocking dielectric stack is then photolithographically patterned to form a floating gate pillar 3 covered by the patterned blocking dielectric layer 9. During the patterning (i.e., etching), the tunneling dielectric layer 7 is also etched to expose portions 19 of the first electrode 11, such that the tunneling dielectric layer 7 remains on portion 17 of the electrode 11 under the pillar 3.

The separator dielectric 15 is formed adjacent at least one sidewall of the pillar 3. For example, the separator dielectric may be formed by depositing a silicon oxide layer over the pillar 3 and over the blocking dielectric 9, followed by a conventional sidewall spacer anisotropic etch. The separator dielectric 15 forms sidewall spacers on the pillar 3. Alternatively, the separator dielectric may be formed by oxidizing the exposed sidewalls of the polysilicon pillar 3 in an oxygen containing ambient to form a silicon oxide separator dielectric layer 15 on the pillar sidewalls.

The resistive element 5 is then formed adjacent to the separator dielectric 15. The resistive element may be formed by depositing an undoped or lightly doped polysilicon layer over the blocking dielectric 9 and over the separator dielectric 15 followed by a sidewall spacer anisotropic polysilicon selective etch to form resistive element 5 sidewall spacers adjacent to the separator dielectric 15. The resistive element 5 contacts the first electrode 11 in region(s) 19. If the resistive element 5 is a diode, then the diode is formed by ion implanting dopant of one conductivity type into the upper portion of the polysilicon layer which is doped with dopant of the opposite conductivity type.

The second electrode 13 is then formed over the blocking dielectric 9 and over the pillar 3 using methods similar to those used to form the first electrode. The second electrode electrically contacts the upper portion of the resistive element 5. If trenches are provided, then the electrode(s) 11, 13 may be formed by the damascene (i.e., trench fill followed by planarization) process.

To form an array shown in FIG. 2, an insulating fill layer is deposited over and around the cell 1 before or after the deposition of the electrode 13. The fill layer deposition is followed by planarization of the fill layer by chemical mechanical polishing or etch-back. If the fill layer is formed prior to the formation of the electrode 13, then the planarization exposes the upper portion of the resistive element 5. If the fill layer is formed after the formation of the electrode 13, then the planarization exposes the upper surface of the electrode 13.

The cell comprises a readable, writable and erasable nonvolatile memory cell. FIGS. 3A to 5B illustrate a method of operating the two terminal nonvolatile memory cell 1. The read, write and erase steps are generated by one or more driver circuits or other control circuits. For example, the array of cells shown in FIG. 2 may be controlled by a row driver circuit connected to the row electrodes and a column driver circuit connected to the column electrodes.

Figure 3A:
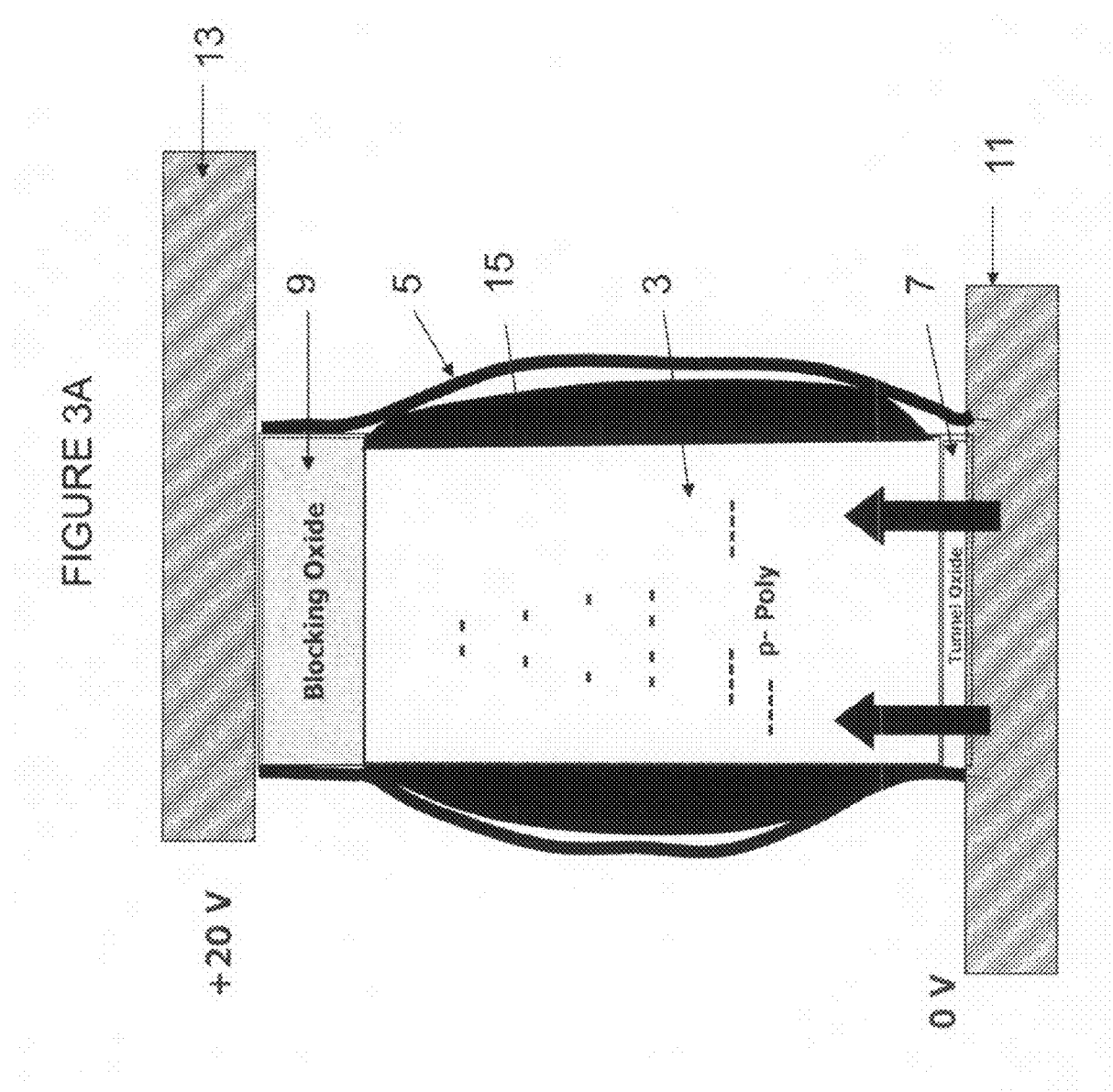
Figure 3B:
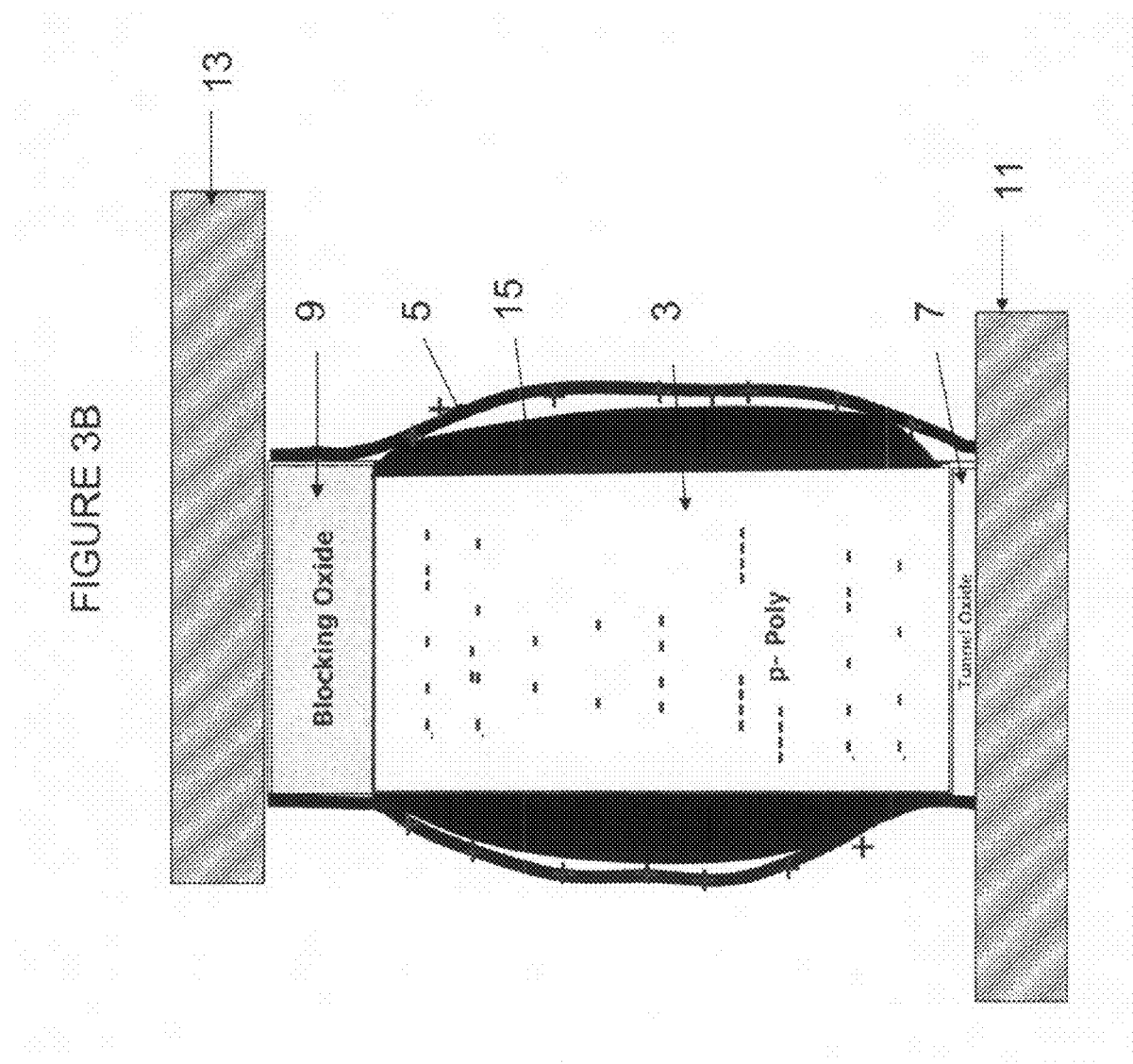

FIGS. 3A, 3B and 3C illustrate a data writing step of an unprogrammed cell 1 (also referred to as a "bit"). In this step, charge (such as electrons or holes) is injected into the charge storage medium 3 through the tunneling dielectric 7. This can be performed by raising the second (column) electrode 13 to a high write voltage, such 10 to 25V, for example 20V, and keeping the first (row) electrode 11 at 0V. FIG. 3A shows the cell 1 during the write step. In general, the data writing step includes applying a write voltage having a first magnitude between the first electrode 11 and the second electrode 13 such that charge carriers are injected in a direction from the first electrode 11 into the charge storage medium 3 through the tunneling dielectric 7.

FIG. 3B shows the cell 1 after the write step, where the charge is stored in the charge storage region 3. The stored charge lowers the resistivity of the resistive element 5 by at least one order of magnitude, such as by two to four orders, for example by about three orders of magnitude, by creating an inversion region in the resistive element. In other words, if electrons are stored in the charge storage region 3, then this creates a positive inversion region in the p-type doped resistor 5, which lowers its resistance from about $10^{12}$ to about $10^9$ Ohms.

As shown in FIG. 3C, the other row and column electrodes 111 and 113, respectively, in the array can be raised to an intermediate voltage, such as 5 to 15V, for example 10V, to prevent writing (i.e., programming) the other unselected cells 101 in the array.

Figure 4A:
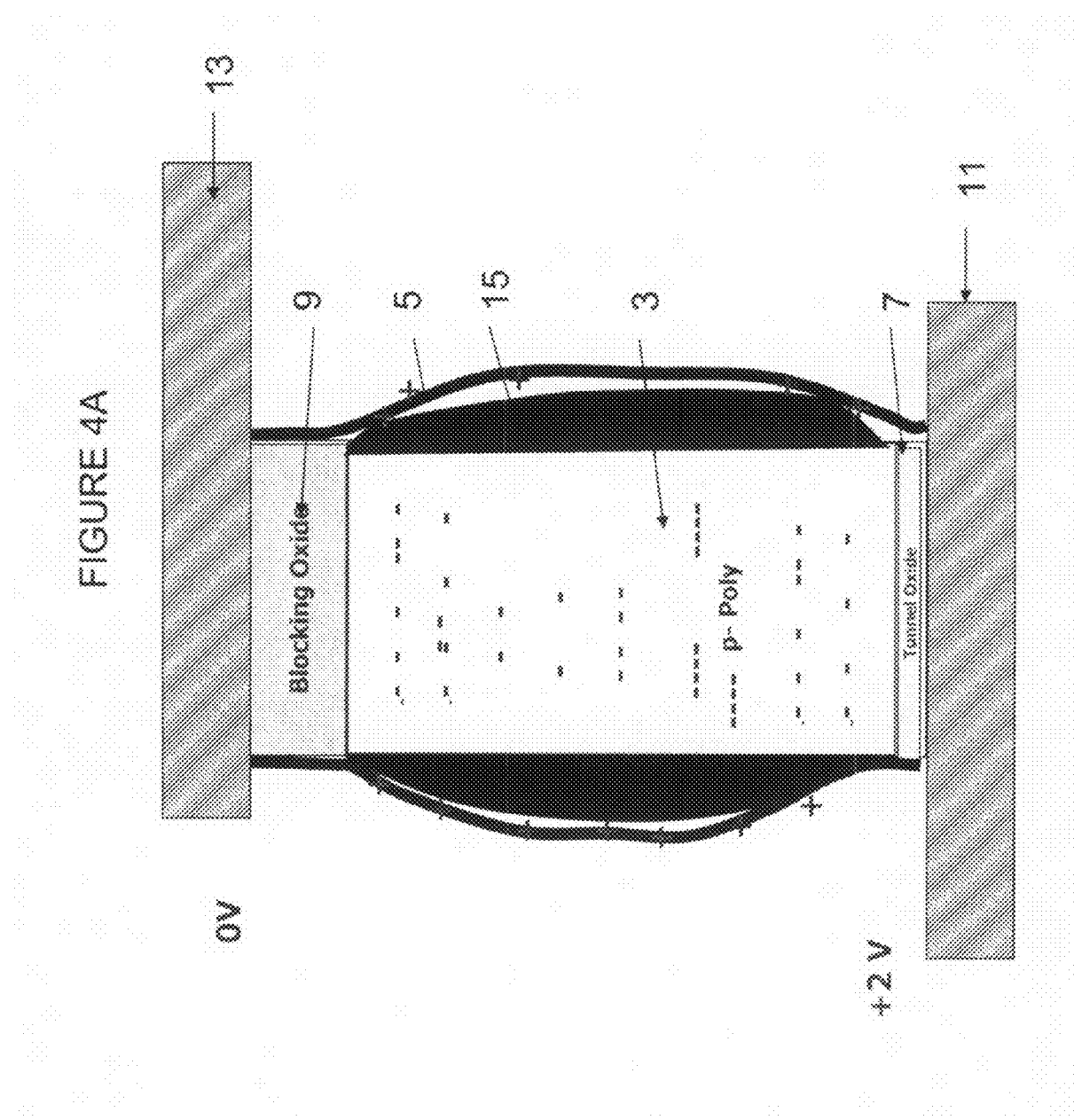

FIGS. 4A and 4B illustrate a data reading step of cell 1. The data reading step includes sensing a resistivity of the resistive element 5. Since the resistivity (or resistance) of the resistive element varies based on a presence or absence of charge being stored in the charge storage medium 3, the reading step allows the determination of whether the cell 1 has been programmed or not.

In the reading step, the first (row) electrode 11 is raised to a low read voltage, such as 1 to 4V, for example about 2V, while the second (column) electrode 13 is kept at 0V. As shown in FIG. 4B, the other row electrodes 111 in the array may be kept at 0V, while the other column electrodes 113 may be raised to a low voltage, such as 2V.

This causes a current to flow through the resistive element 5 between the electrodes 11, 13 in the cell 1. The magnitude of the read current depends on the magnitude of the resistivity of the resistive element 5 which in turn is affected by whether charge is stored in the charge storage medium 3 (i.e., by whether the cell 1 is programmed or not). For example, the detected read current of the programmed cell may be higher than the read current of the unprogrammed cell. In general, the data reading step includes applying a read voltage having a second magnitude less than the first (write) magnitude between the first electrode 11 and the second electrode 13 and measuring a read current through the resistive element 5 between the first and the second electrodes.

Figure 5B:
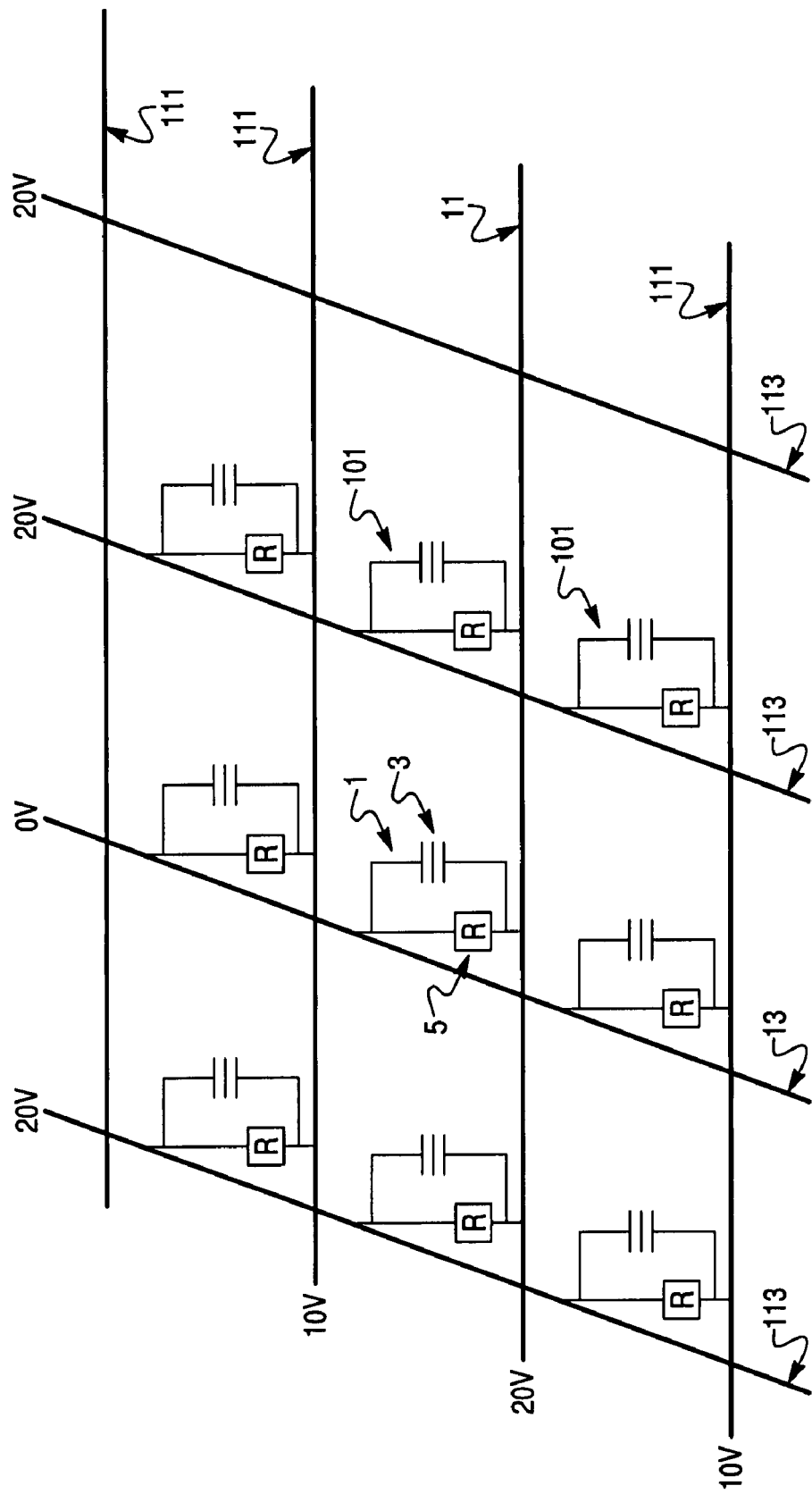

FIGS. 5A and 5B illustrate a data erasing step. In this step, a high voltage is applied to the first (row) electrode 11, while the second (column) electrode 13 is maintained at 0V. As shown in FIG. 5B, the other row electrodes 111 in the array can be raised to an intermediate voltage, such as 5 to 15V, for example 10V, while the other column electrodes 113 can be raised to a high voltage, such as 10 to 25V, for example 20V to prevent erasing the other unselected cells 101 in the array. In general, the data erasing step includes applying an erase voltage between the first electrode 11 and the second electrode 13 such that stored charge carriers are removed from the charge storage medium 3 in a direction toward the first electrode 11 by tunneling through the tunneling dielectric 7.

Formation and operation of a first memory level of the array has been described. Optionally, additional memory levels can be formed above this first memory level to form a monolithic three dimensional memory array. In some embodiments, conductors can be shared between memory levels; i.e. top conductor 13 would serve as the bottom conductor of the next memory level. In other embodiments, an interlevel dielectric (not shown) is formed above the first memory level of FIG. 2, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No.

5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Detailed methods of fabrication have been described herein, but any other methods that form the same structures can be used while the results fall within the scope of the invention. The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of operating a two terminal nonvolatile memory cell, comprising:
    a data writing step comprising injecting charge into a charge storage medium through a tunneling dielectric; and
    a data reading step comprising sensing a resistivity of a resistive element connected in parallel with the charge storage medium between a first and a second electrode, wherein the resistivity of the resistive element varies based on a presence or absence of charge being stored in the charge storage medium;
    wherein a tunneling dielectric layer is located between the first electrode and the charge storage medium.

2. The method of claim 1, wherein the data writing step comprises applying a write voltage having a first magnitude between a first electrode and a second electrode such that charge carriers are injected in a direction from the first electrode into the charge storage medium through the tunneling dielectric.

3. The method of claim 2, wherein the data reading step comprises applying a read voltage having a second magnitude less than the first magnitude between the first electrode and the second electrode and measuring a read current through the resistive element between the first and the second electrode, wherein a presence or absence of charge being stored in the charge storage medium affects a magnitude of the measured read current.

4. The method of claim 3, further comprising a data erasing step by applying an erase voltage between the first electrode and the second electrode such that stored charge carriers are removed from the charge storage medium in a direction toward the first electrode by tunneling through the tunneling dielectric.

5. The method of claim 1, wherein the tunneling dielectric is sufficiently thin to allow charge carriers to tunnel between the first electrode and the charge storage medium through the tunneling dielectric.

6. The method of claim 5, wherein the charge storage medium comprises a charge storage dielectric layer which is located between the tunneling dielectric layer and a blocking dielectric layer.

7. The method of claim 6, wherein the tunneling dielectric comprises a silicon oxide layer, the charge storage dielectric layer comprises a silicon nitride layer and the blocking dielectric comprises a silicon oxide layer to form an ONO structure.

8. The method of claim 5, wherein the charge storage medium comprises a semiconductor floating gate which is located between the tunneling dielectric layer and a blocking dielectric layer.

9. The method of claim 5, wherein the resistive element comprises a semiconductor resistor.

10. The method of claim 5, wherein the resistive element comprises a semiconductor diode.

11. The method of claim 5, wherein a separator dielectric layer is located between the resistive element and the charge storage medium, wherein the separator dielectric is sufficiently thin to allow a presence or absence of charge being stored in the charge storage medium to affect the resistivity of the resistive element.

12. The method of claim 11, wherein:
    the first electrode is formed over a substrate;
    the tunneling dielectric is formed on a first portion of the first electrode;
    the charge storage medium comprises a pillar which is formed on the tunneling dielectric;
    the separator dielectric is formed adjacent at least one sidewall of the pillar;
    the resistive element is formed adjacent to the separator dielectric to electrically contact the second electrode and a second portion of the first electrode;
    a blocking dielectric is formed over the pillar; and
    the second electrode is formed over the blocking dielectric and over the pillar.

13. The method of claim 12, wherein:
    the separator dielectric surrounds the pillar; and
    the resistive element surrounds the separator dielectric.

14. The method of claim 1, further comprising operating an array of the two terminal nonvolatile memory cells.

* * * * *